United States Patent
Le et al.

(10) Patent No.: US 8,552,898 B2
(45) Date of Patent: Oct. 8, 2013

(54) APPARATUS AND METHOD FOR DYNAMICALLY DAMPENING A TRANSIENT STEP RESPONSE

(75) Inventors: Jim Kien Huy Le, Fairview, TX (US); Abidur Rahman, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 46 days.

(21) Appl. No.: 13/341,501

(22) Filed: Dec. 30, 2011

(65) Prior Publication Data

US 2013/0169462 A1    Jul. 4, 2013

(51) Int. Cl.
*H03M 1/78* (2006.01)

(52) U.S. Cl.
USPC .......................................... 341/154; 341/144

(58) Field of Classification Search
USPC .......................................... 341/145, 144, 154
See application file for complete search history.

(56) References Cited

U.S. PATENT DOCUMENTS

| | | | |
|---|---|---|---|
| 5,808,576 A | | 9/1998 | Chloupek et al. |
| 6,166,672 A | * | 12/2000 | Park ............................... 341/145 |
| 7,903,012 B2 | * | 3/2011 | Inoue et al. ................... 341/144 |
| 7,956,786 B2 | * | 6/2011 | Cosgrave ...................... 341/145 |
| 2009/0031264 A1 | | 1/2009 | Rittman et al. |

OTHER PUBLICATIONS

Universal Serial Bus 3.0 Specification, Revision 1.0, Nov. 12, 2008.

* cited by examiner

*Primary Examiner* — Jean B Jeanglaude
(74) *Attorney, Agent, or Firm* — Alan A. R. Cooper; W. James Brady, III; Frederick J. Telecky, Jr.

(57) ABSTRACT

A circuit has a digital to analog (DA) resistance ladder having an analog output; a capacitor coupled to the analog output; a first resistance coupled from the capacitor to ground; and a switch coupled to the capacitor in parallel to the resistor, wherein the switch, when closed, has a second resistance, and the first resistance is greater than the second resistance.

20 Claims, 8 Drawing Sheets

APPARATUS AND METHOD FOR DYNAMICALLY DAMPENING A TRANSIENT STEP RESPONSE

TECHNICAL FIELD

This Application is directed, in general, to dynamically dampening a transient step response and, more specifically, to dynamically dampening a transient step response in a digital potentiometer.

BACKGROUND

Turning to FIG. 1A-1B, disclosed are various prior art digital potentiometer (DP) ladders. DP ladders can be used in digital to analog converters.

In FIG. 1A, a DP ladder 100 is disclosed. In the DP ladder 100, there are a plurality of resistors, each one with a substantially equal value. Therefore, the voltage output at node "W" is determined in a linear manner as determined by which one of switches 101-108 are closed. A disadvantage of the DP ladder 100 is that a corresponding switch is needed for each graduated voltage level, and therefore the DP ladder 100 has substantial implementation drawbacks. One reason for these drawbacks is that implementing these switches is not practical for a DP is because the "variable resistance" function of a DP requires that these switches be very low ohmic, or very large (i.e. more area, more cost).

FIG. 1B is directed to one aspect of a DP ladder 160, as disclosed in "Resistor String Digital-to-Analog Converter", U.S. Pat. No. 5,808,576 to Chloupek, et al. FIG. 1B employs a top array of resistors RTOP and a bottom array off resistors RBOT, wherein a sum of the first variable resistance of the RTOP and the second variable resistance of RBOT is a fixed resistance value. This approach is also advantageous over FIG. 1A, in that the number of switches needed to convey an analog value is greatly reduced when compared to the DP ladder 100.

However, although the DP ladder 160 has significant advantages when compared to the DP ladder 100, it also has certain significant disadvantages as well.

A glitch can be generally defined as an unwanted/undesired analog signal spike, be it voltage, current, etc., that exceeds a selected criteria. A common problem encountered in multiple string architectures, such as that of a DP ladder, is the presence of a large undesired transient (a "glitch") in the transient response during a certain code-to code transitions. Code-to-code transitions can be generally defined as a change of a first digital value to a second digital value to be output as an analog signal. Undesired output transients, i.e. "glitches", such as can occur with the DP ladder 160.

Aside from impacting the signal integrity of the output, this undesired transient can have serious implications at the system level where an entire system can be overdriven, leading to possible breakdown and/or settling time issues. Improvement in this undesired transient has variously been addressed either by reducing the sources that contribute to the undesired transient and/or dampening the undesired transient with a large capacitor.

Reduction of the undesired transient contributors typically has a lower practical limit due to such factors as large coupling parasitics present in a digital to analog converter (DAC), such as a digital potentiometer. This is further complicated by the fact that each transition relies on precise simultaneous switching of different strings.

Most of the approaches targeting purported sources of the undesired output transient in DP ladders tend to be implemented at the switch level, for example, adding dummy switches, slowing the switch ramp rate, staggering the switching of the individual fingers, etc. Disadvantageously, these techniques typically slow down the settling time of the transient, and tend to require a larger area overhead as the number of switches in the DAC/digital potentiometer increases.

Capacitors have been used to dampen an undesired transient have been used in the prior art. However, capacitors, especially large capacitors, can also significantly increase the transient settling time, and furthermore typically degrades the operation of the digital potentiometer in terms of frequency throughput.

Generally, one possibility to avoid output undesired transients on an analog output is to dynamically switch an output capacitor in and out when needed. As the digital potentiometer (or other analog output device) has a high impedance output node for the analog signal, the capacitor therefore should to be pre-charged to be equal to an output voltage before being connected to the output. However, this approach requires additional overhead both in area and power for the pre-charging circuitry.

FIG. 2 illustrates an alternative aspect of a DP ladder, a prior art "sliding scale" DP ladder 201. In the DP ladder 201, a coarse string is segmented based upon the upper most significant bits (MSBs), and a fine string is segmented based upon the least significant bits (LSBs).

An advantage of the DP ladder 201 over the DP ladder 100 is that the number of switches needed to represent an analog value is greatly reduced, for example from 128 switches to 32 switches, wherein the number 128 is derived from an example of a 7-bit DP. The number of switches can depend upon the segmentation of the coarse/fine strings. If the coarse string was the upper 4 MSB bits, you would have $2^4$=16 switches (each switch represents 1 code) at the DP ladder. This means that the fine string has $2^3$=8 switches, and since two fine strings are employed, the total switch count is $2^4+2*2^3$=32 switches compared to 128. Another advantage is that larger resistances can be used in the DP ladder 130, which is advantageous in terms of accuracy and precision of manufacturing processes.

Generally speaking, a goal of a code-to-code transition in the DP is to change the DP ladder 201 by a single LSB unit. For a typical transition, what happens is that the two LSB strings 220 and 225 both change by one LSB. This causes both ends of the MSB string to "slide" up (or down) by one LSB. Since this is a passive string, all the intermediate nodes in the MSB string will also "slide" by one LSB and the desired change is obtained at the output.

For example, at code 0, the switches that are turned on are 226, 221, and 253. For a transition to code 1, the switches will change to 227, 222, and 253 (note that the MSB switch doesn't change). A problematic transition is when the transition involves changing a switch in MSB string 250. For this example, this would be from code 2 (228, 223, and 253) to code 3 (226, 221, and 252).

What happens here is that both the LSB strings 220 and 225 are making a change of −(1 MSB−1 LSB). Again, both sides of the MSB string 250 see the −(1 MSB−1 LSB) change and so all the intermediate nodes (i.e. the one connected to switch 252) also see this −(1 MSB−1 LSB) change. At this same instance, changing from 253 to 252 results in a +1 MSB change at the wiper terminal. By superposition, the net change is the sum of these two changes [+1 MSB−(1 MSB−1 LSB)]=+1 LSB and so the desired change is obtained at the output. The problem is that these two changes should occur at the same exact instance.

For example, if the +1 MSB changes first, then a glitch of +1 MSB occurs before and vice versa if the −(1 MSB−1 LSB) changed first, changes of switches 221-223 and 226-228 the LSB strings 220, 225, without a MSB change 250, generally does not lead to significant undesired transient (glitch), "significant" generally defined as, such as glitch comparable to the size of 1 LSB unit. However, a transition of a switch 251-253 of MSB 250, especially with a change of the switch of the LSB string 220, 225 can lead to significant glitches.

Turning now to FIG. 3, illustrated is a graph of glitches associated with prior art DP ladders. As is illustrated, a transition of 0x3Fh to 0x40h leads to significant glitches on an output analog node. In other words, a change from binary equivalent of "63" 0111111 to the binary equivalent of "64"1000000, the LSB bits 0"111111" converting to 1 "0000000" and the MSB bit "0"111111 converting to a 1 "0000000", results in a significant glitch. In one example, basically, any change in the MSB string results in a significant glitch. If the MSB string represents the upper 4 bits of the digital code, then a glitch results when any of those upper 4 bits change.

Turning now to FIG. 4, illustrated is a simulation of a quantification of various potential undesired transients that occur for various LSB transitions around an MSB boundary. In the simulation, ether is a 150 mV glitch. Generally, terminology used in the D/A industry to quantify the transient glitch of a D/A converter is to referred to as the "Midscale Glitch". One reason behind this is that for many D/A architectures, the worst case glitch occurs at midscale and that's what is typically used as a measuring gauge. However, in FIG. 4, all of the transient simulations that had a glitch were overlaid, and the worst one was not the transition at midscale.

Therefore, there is a need in the art to address at least some of the issues associated with conventional DACs, such as digital potentiometers.

SUMMARY

A first aspect provides a circuit, comprising: a digital to analog (DA) resistance ladder having an analog output; a capacitor coupled to the analog output; a first resistance coupled from the capacitor to ground; and a switch coupled to the capacitor in parallel to the resistor, wherein the switch, when closed, has a second resistance, and the first resistance is greater than the second resistance.

A second aspect provides a system comprising: an analog output; a capacitor coupled to the analog output; a first resistance coupled from the node to ground; a switch coupled to the node in parallel to the resistor, wherein the switch, when closed, has a second resistance, and the first resistance is greater than the second resistance; a driver coupled to a gate of the switch; and a logic coupled to the driver, wherein the logic directs the driver to: a) close the switch to mitigate a transient in the analog output, and b) open the switch after the transient has occurred.

In a third aspect, a method provides generating a voltage on an output node, charging a capacitor coupled to the output node and to a first resistance that is coupled to ground; determining if a spike is occurring on the output node; closing a switch that is coupled to the output node that is also coupled in series with the first resistance; shorting the resistance to the capacitor; mitigating a spike by employment of the capacitor; and opening the switch coupled to the capacitor.

BRIEF DESCRIPTION OF THE DRAWINGS

Reference is now made to the following descriptions.

DETAILED DESCRIPTION

Figure 1A:
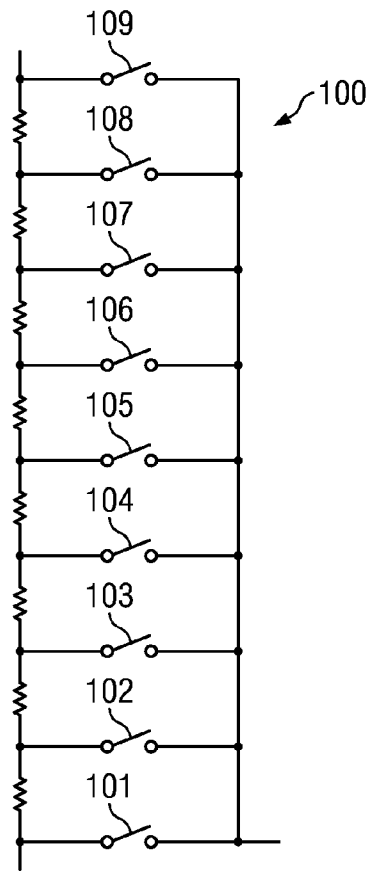
FIG. 1A-1B illustrate prior art digital voltage potentiometers, useful in digital to analog conversion.
Figure 1B:
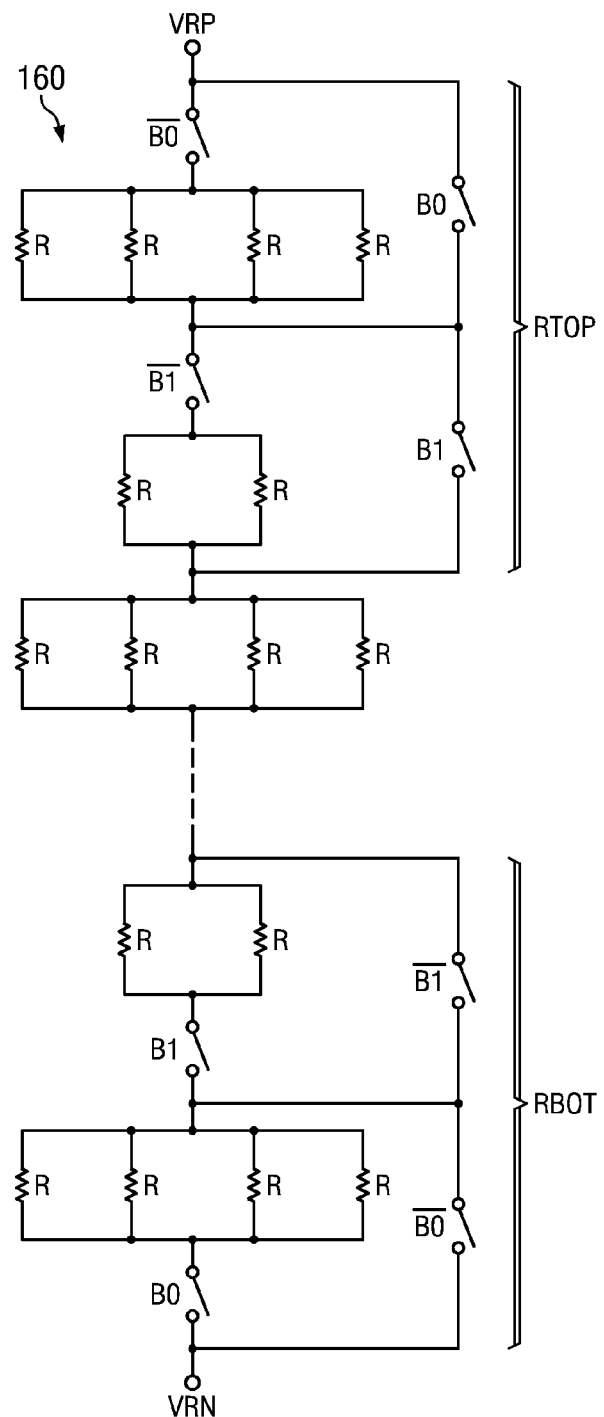
Figure 2:
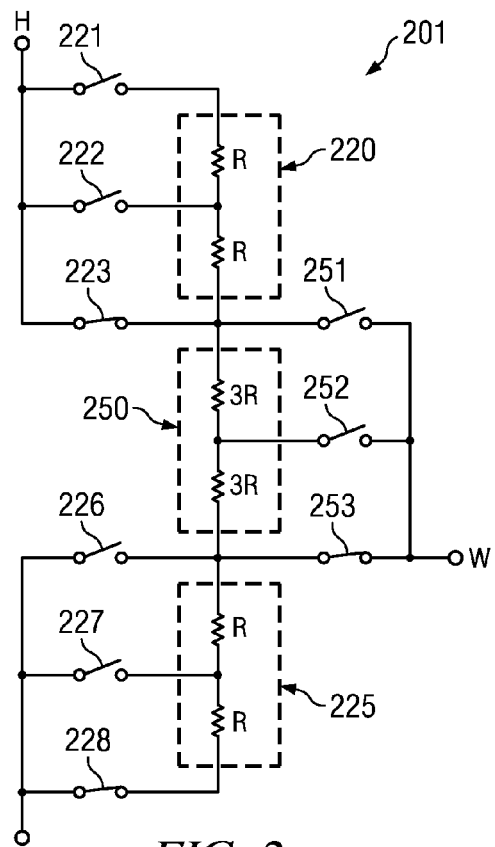
FIG. 2 illustrates a prior art switching of a voltage potentiometer.
Figure 3:
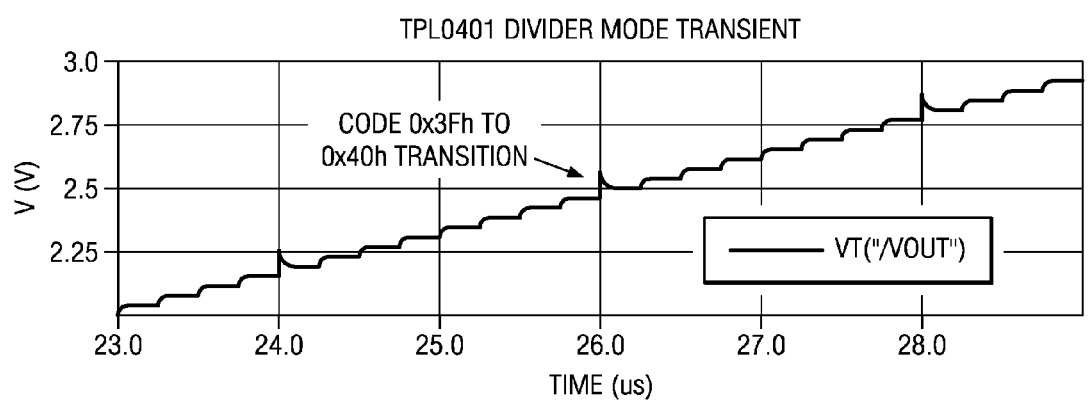
FIG. 3 is an illustration of a prior art graph of an output voltage of an undesired transient when transitioning from a LSB to another LSB.
Figure 4:
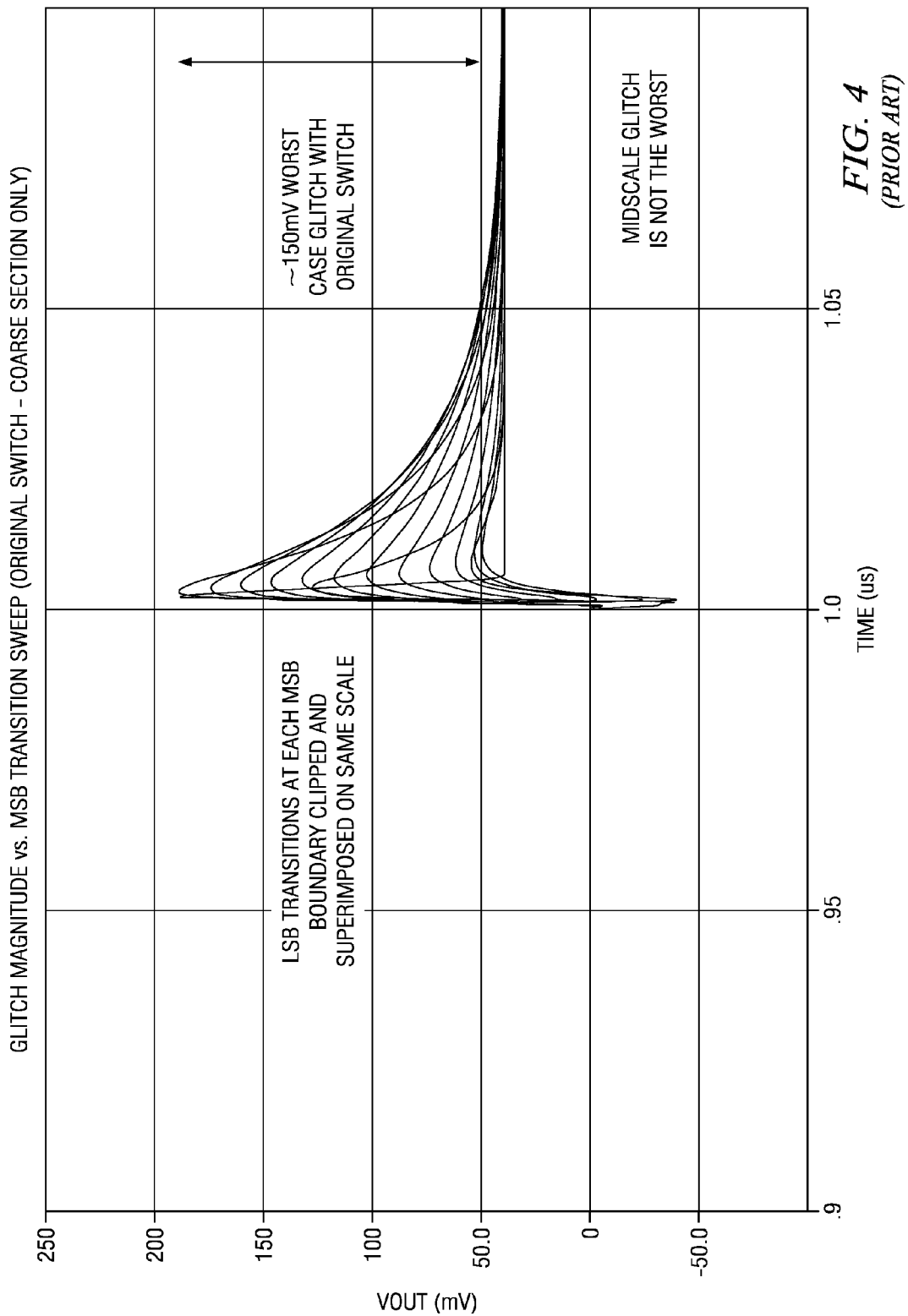
FIG. 4 is an illustration of a prior art graphing overlap of various glitches when transition from an LSB to another LSB.
Figure 5:
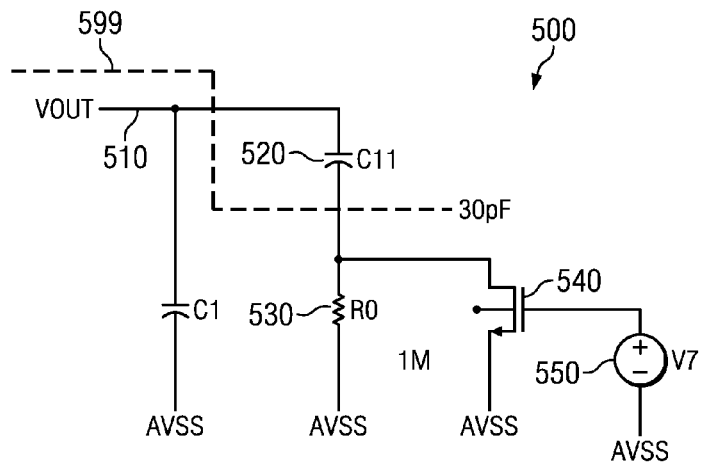
FIG. 5 is an illustration of a circuit that dynamically dampens a transient response.

Turning to FIG. 5, illustrated is a circuit 500 for dynamically dampening a transient response. Generally, in the circuit 500, a switch 540 shorts a large resistor 530, coupled in series with a dampening capacitor 520, when the dampening capacitor 520 is needed to mitigate a undesired transient (a "glitch") on an analog output node 510 (VOUT).

In the circuit 500, the analog output node 510 is coupled to the dampening capacitor 520. The first resistor 530 is coupled from the dampening capacitor 520 to a sink voltage (AVSS), which can be ground. A switch 540 is coupled to the dampening capacitor 520, and is also coupled in parallel to the resistor 530. The switch 540 can be a NFET or a PFET. A driver 550 is coupled to a gate of the switch 540. In the circuit 500, the switch 540, when closed, has its own internal resistance (a "second" resistance), and a resistance of the first resistor 530 is greater than the second resistance.

In the circuit 500, the driver 550 receives signals from a coupled logic (not illustrated), wherein the logic can direct the driver 550 to: a) close the switch 540 to mitigate an undesired transient in an analog output at node 510, and b) open the switch 540 after the undesired transient has occurred.

In the circuit 500, the series resistor 530 is sized such that an RC time constant of the dampening capacitor 520 and the resistor 530 is significantly larger than the time constant of the output node 510. In other words, the time constant of the dampening capacitor 520 and the resistor 530 is such that different steps of analog voltages can occur at the analog output node 510, without a substantial current source or current sink occurring from the dampening capacitor 530, due to a high time constant for the resistor 520 and the dampening capacitor 530. In other words, for "constant output", the switch 540 stays open.

However, upon a glitch occurring, or a prediction of glitch occurring, on the output node 510 by a logic, the switch 540 is closed by the driver 550. When the switch 540 was open it had, many orders of magnitudes higher than resistance 530. However, when the switch 540 is closed by the driver 550, it has an inherent short resistance that is at least a magnitude order (base 10) less than that of the resistance of the resistance 530.

This shorted resistance of the switch 540, in turn, creates a significantly shorter time constant of the capacitor 520 and the switch 540, than capacitor 520 and the resistor 530. Therefore, the capacitor 520 is significantly more reactive to changes to voltages or currents on the analog output node 510, and can therefore more readily absorb glitches on the node 510.

Then, after the transition of the step response of the glitch has occurred, the switch 540 is opened, and the response/time constant of the capacitor 520 becomes much slower, a voltage difference before a step transition and after a step transition first manifests over the resistor 530. As resistor 530 has a large resistance, any change of voltage over the capacitor advantageously occurs very slowly when the circuit 500 is not anticipating a glitch, mitigating any negative effect the capacitor 520 might have on an output signal.

Particular values of particular resistances, capacitors, and switches can be selected to give various time constants. For example, in one aspect, the capacitor 530 has a value of 30 picofarads ($3 \times 10^{-6}$ Farads), and the resistor 520 has a value of 1 million Ohms ($10^6$ Ohms.) This leads to a time constant of 3 seconds, well in excess of typical standard DA conversion times. For example, a DP as discussed later on in this Application can perform D2A conversion. In one example, the time constant of the output in the data processing example is 25 ns, and assuming 3 time constants for settling, the conversion rate is 13.3 Megasamples per second. Therefore, advantageously, the capacitor 530 might not act as a significant source or a sink to an analog output signal. However, the resistance of the switch 540 when shorted can be, for example, 10 ohms, which leads to a time constant of 300 µs, significantly shorter than the above example of time periods between digital potentiometer conversions, thereby mitigating, which can include completely eliminating, an output glitch for that transitional state at output node 510.

In the circuit 500, the capacitor 520 can be integrated within an integrated circuit (IC) 599 containing the rest of circuit 500, or alternatively, outside the IC 599. Having the capacitor outside of the rest of the circuit allows the capacitor 520 to be replaceable with different capacitive values in such a manner can allow for a user to select from a range of time constants associated with the capacitor 520, thereby allowing the customer to make a wide variety engineering trade-offs between glitch mitigation and overall data throughput within the circuit 500. Another advantage is that this allows is using large capacitor values that wouldn't have been practical to implement on-chip.

Figure 6:
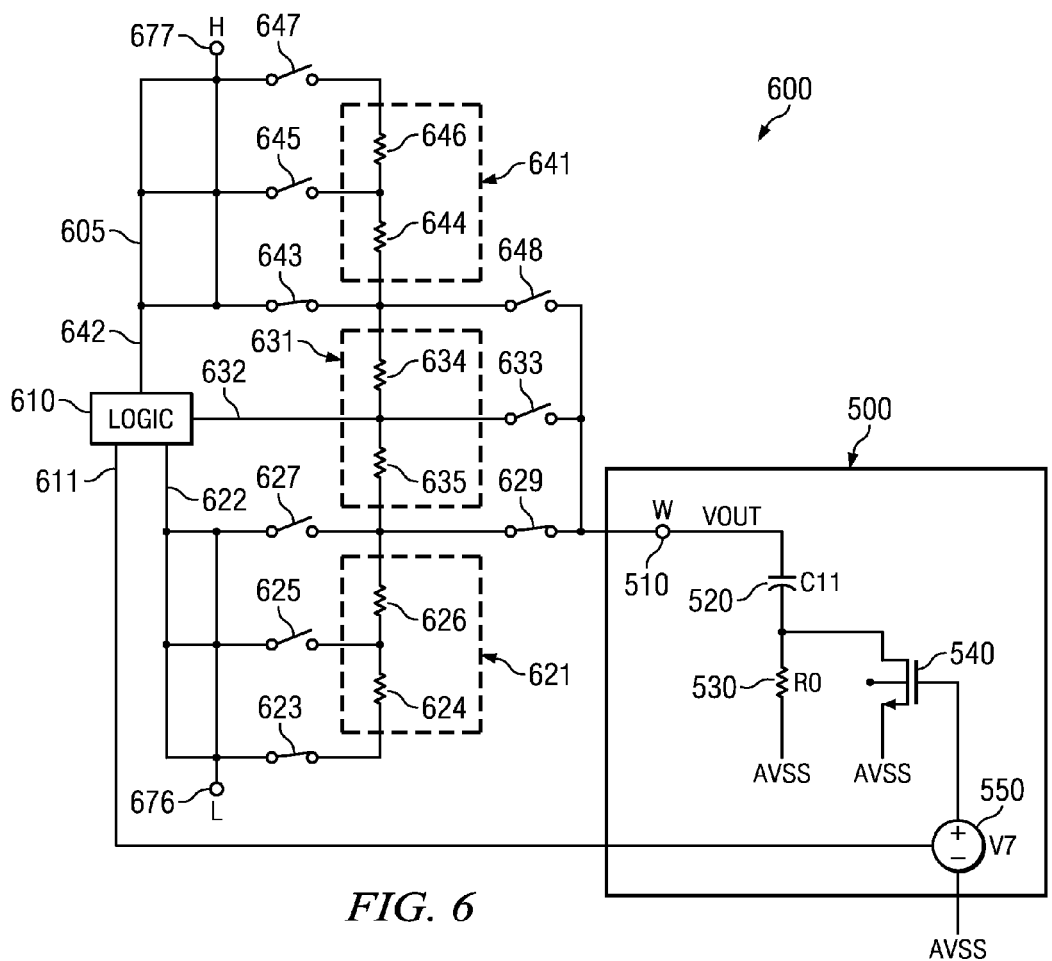
FIG. 6 illustrates a DAC ladder with a circuit that dynamically dampens a transient response.

Turning to FIG. 6A, a transient dampening system 600 is illustrated. In transient dampening system 600, the circuit 500 is coupled to an output of a first ladder DP 605. A logic 610 is coupled over a line 611 line to the driver 550 of the circuit 500. An analog signal of the analog signal output W 510 is a voltage value between the voltage source and the voltage sink.

The logic 610 is also coupled over a line 622 to a first set of LSB ladder switches 623, 625, 627 of an LSB set 621. The first set of LSB switches 623, 625, and 627 control how an LSB resistor 624 and 624 of the first LSB set 621 interacts with a voltage sink 676, and how it affects the voltage at W analog output node 510.

The logic 610 is coupled over a line 632 to a set of MSB ladder switches 629, 643 of an MSB set 631. The set of MSB switches 623, 625, 627 control how an MSB resistor 634 and 635 of MSB set 631 interact with the voltage sink 676 and the voltage source 677, and how it affects the voltage at analog output node 510.

The logic 610 is also coupled over a line 642 to a second set of LSB ladder switches 643, 645, and 647 of an LSB set 641. The second set of LSB switches 643, 645, and 647 control how an LSB resistor 644 and 646 of the second LSB set 641 interact with a high voltage source 677, and how it affects the voltage at W analog output node 510.

In the system 600, the logic 610 controls the switches corresponding to LSB sets 621, 641, and MSB 631, to control an output voltage of a digital potentiometer. The logic 610 also conveys a signal to the driver 550 when an output transition is to take place, thereby turning on the switch 540. The logic 610 then commands the driver 550 to turn the switch 540 off after a certain length of time.

In the circuit 600, the switch 540 should be turned on gradually, such as over a 50 ns ramp, so that this transition is not coupled back to the output node 510. In other words, if the switch 540 is turned on "too quickly" it will create a current spike through the switch 540, which could rapidly deplete charge stored in the capacitor 520, thereby affecting the voltage across the capacitor 520.

In a further aspect, the logic 610 is programmable by a user to allow for varying times to elapse before the logic 610 commands the driver 550 to close the switch 540 again after a given selected transition that has a "glitch". This can be especially advantageous, in that the capacitance value of the capacitor 520 can also be changeable by a user, so adaptations can be made for time constants, etc.

In some approaches, the logic 610 is triggered to close the switch 540 to mitigate an output signal transients for any output voltage transition. In other approaches, only particular transitions (such as a both an LSB and an MSB switch changing states) trigger the logic 610 to close the switch 540 to mitigate an output signal glitch for particular output voltage transitions. In some approaches, these trigger transitions can be configured by a user. In other approaches, the logic 610 predicts a magnitude of an output glitch, and determines whether to short the switch 540 based upon that determination.

Moreover, advantageously, in the circuit 600, additional circuitry for smoothing a transient is used at the output node 510, e.g., the capacitor 520, the resistor 530, the switch 540, and the driver 550. This advantageously means that additional circuitry is not generally needed as a function of an increase of a number of LSB/MSB switches used in the digital potentiometer 600.

Furthermore, advantageously, the capacitor 520 is pre-charged during voltage transitions (i.e., because it mitigates or absorbs the transient), so there is not an additional power overhead to pre-charge the capacitor 520. This power overhead described above refers to additional circuitry explicitly used to charge up the capacitor. For example, one might have an op-amp do this pre-charging (need to buffer since using the output itself defeats the purpose of dynamically dampening). Therefore, the choices here are to leave that op-amp on the entire time, or just turn it on when needed. The latter approach is actually even worse, because, if the dampening cap is needed, for example, every 1 usec, then this means that the op-amp would need to power-up and completely settle in a much shorter time.

Still furthermore, the switch 530 does not encounter varying voltage levels, charge injection and feedthrough, as the switch 540 is shielded by the capacitor 530. Regarding charge injection (when the switch turns on/off), the charge from the channel flows back into or from the node between the capacitor and the large resistor. It will look for the lower impedance path which is the resistor and take that path. Hence it doesn't make its way to the output.

In other aspects, other types of DP ladders can be used and substituted in alternatives of the circuit 600 with the circuit 500, such as a "Resistor String Digital-to-Analog Converter", described in U.S. Pat. No. 5,808,576 to Chloupek, et al., which is hereby incorporated by reference in its entirety. For ease of illustration, for the illustrated embodiment, should also be understood that, although FIG. 6 may be illustrated as the lines coupling from the logic core 610 as connected to the internal nodes of the resistor string, but they are actually controlling the switches to the resistor, and the resistors themselves.

Figure 7A:
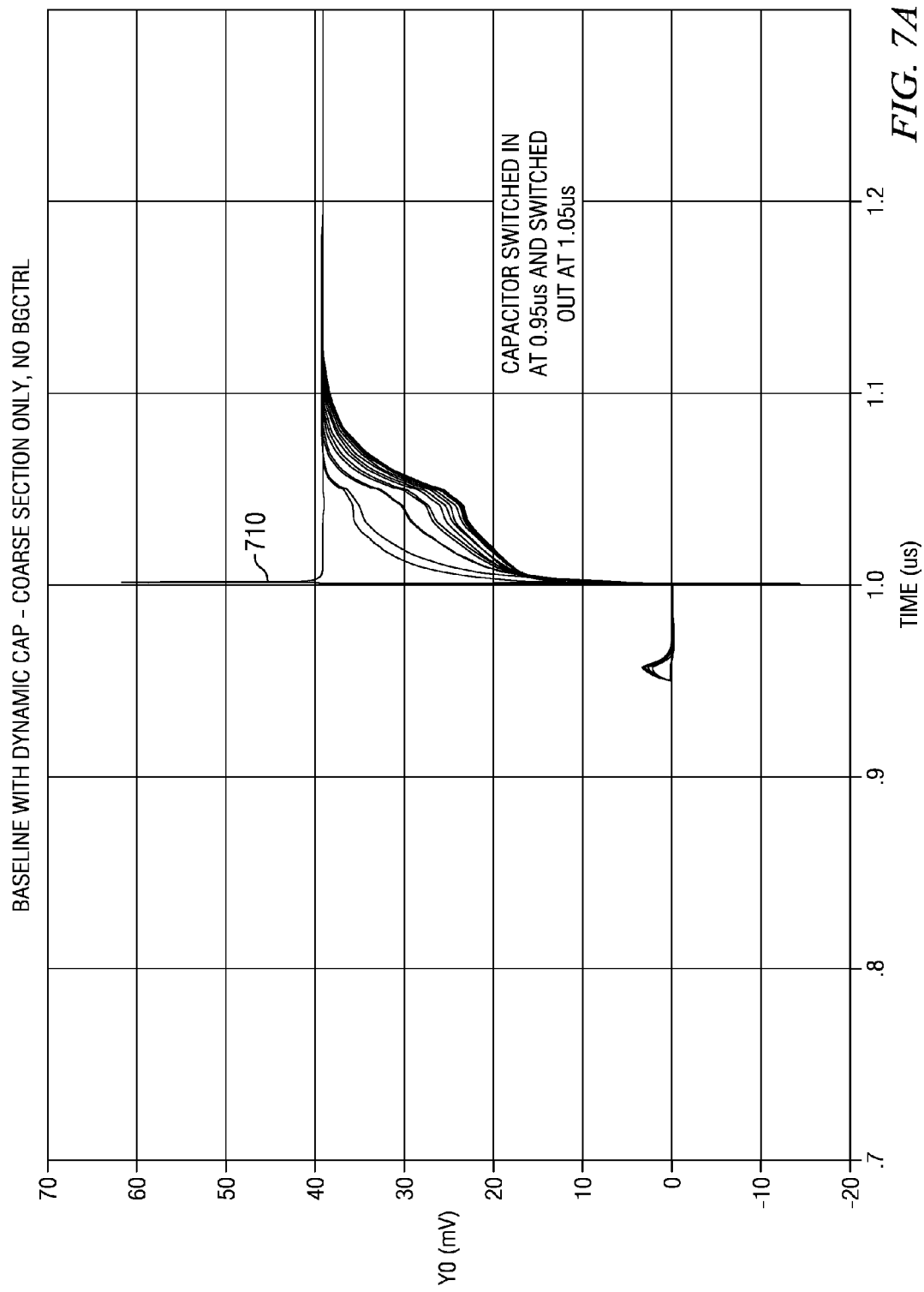
FIG. 7A illustrates simulation test data regarding a switching in and a switching out of a dampening capacitor according to the principles of the present Application.

FIG. 7A illustrates simulation test data regarding switching in and out a capacitor according to the principles of the present Application, such as may be performed by the circuit 500. Ignoring artifact 710, an artifact of the simulation setup. The remaining waveforms are the other "glitch" transitions. In this illustration, the value for the capacitor 50 pF, the resistor is 1 Mega Ohm, and an NFET switch has a resistance of approximately 10 ohms. The mini-glitch is the feedthrough from turning on the switch before the output transition (situation described above in [0050]

In the illustrated example of FIG. 7A, the capacitor 520 is "switched in" at 0.95 us (in other words, switch 530 is turned on, thereby decreasing the time constant of the capacitor and at 1.05 us the capacitor is "switched out", at which time the glitch has already been absorbed.

Figure 7B:
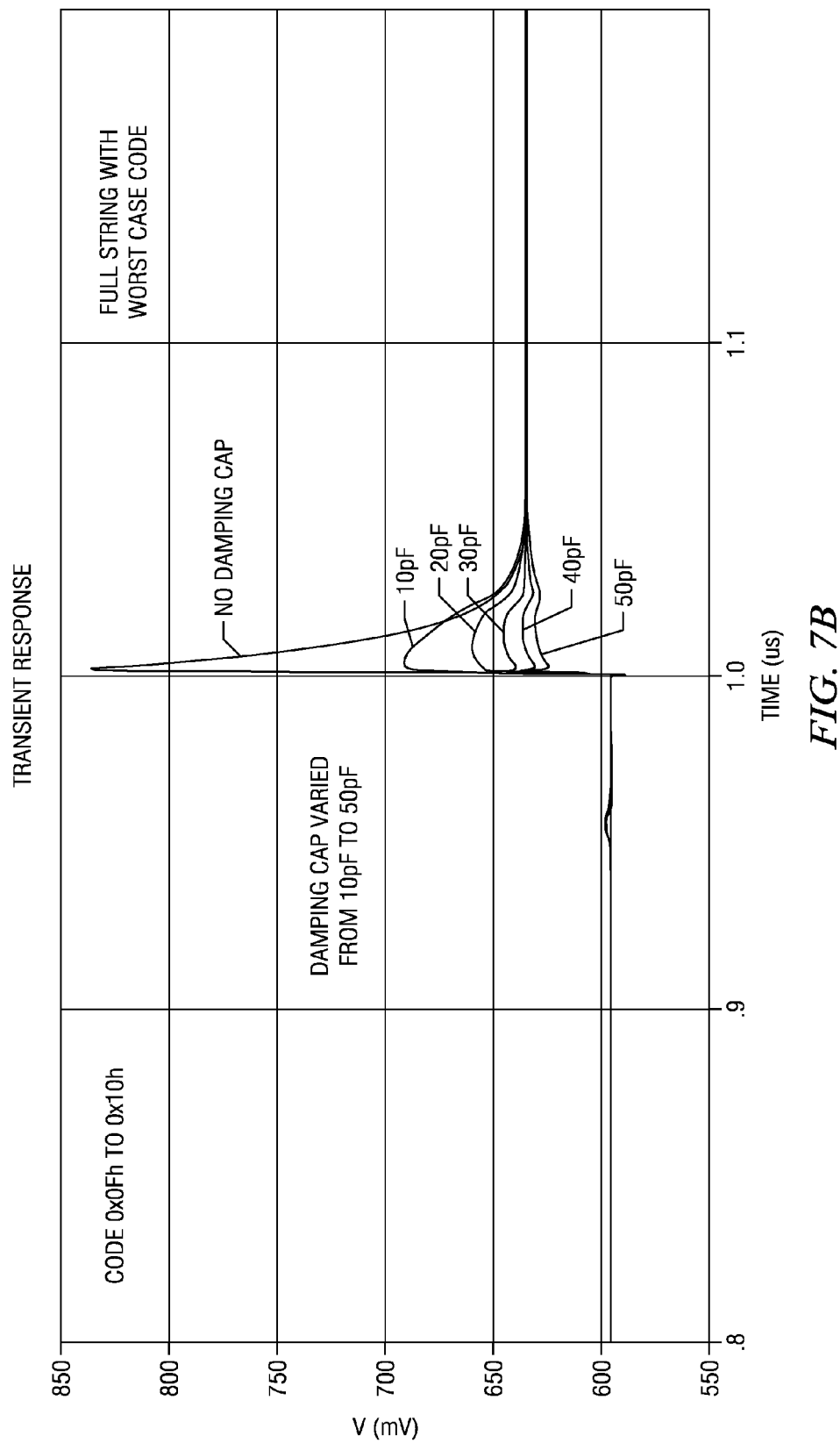
FIG. 7B illustrates the transient (glitch) of an output analog node when simulating the glitch when varying from a value of 0 picofarads (i.e., no dampening capacitor) to 50 picofarads.

FIG. 7B illustrates a simulation of the transient (glitch) of an output analog node when simulating the glitch when varying from a value of 0 picofarads (no dampening capacitor) to 50 picofarads for a dampening capacitor, such as the capacitor 520. As is illustrated, as the capacitor value increases, the transient glitch decreases, until 50 picofarads, wherein the glitch is effectively entirely gone. Moreover, the settling time of the output may not be substantially adversely affected by use of the capacitor 520. In this illustration, the resistances were kept constant at 1 Mega Ohm and 10 Ohms.

Figure 8:
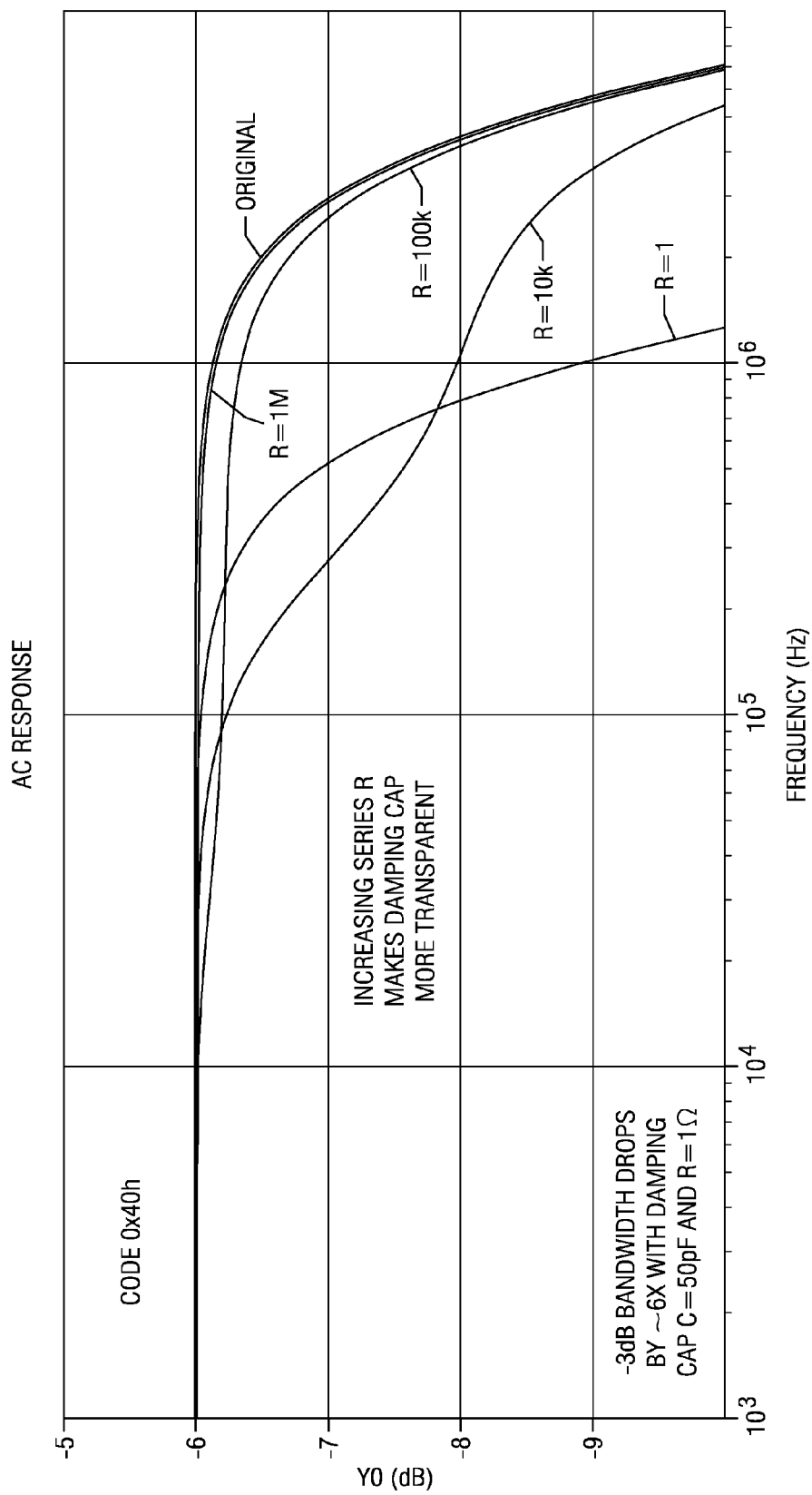
FIG. 8 illustrates a how an output of 0x40h, or 10000000 converted to an analog voltage over different values of series resistances.

FIG. 8 illustrates a simulation of how an output of 0x40h, or 10000000 converted to an analog voltage, and is the frequency response of the DP. In FIG. 8, a bottom side of the DP is ground and has applied across it an AC source at the top. At mid-scale, one basically has half (or −6 dB) of whatever was applied at the top of the string. As the frequency of the input source is varied, the parasitics generated at the output essentially start degrading the response and the magnitude at the output drops. Another way to look at FIG. 8 is that it basically reflects the impedance seen at the output node of a DP (the −3 dB point is proportional to 1/RC at the output). So as seen here, the larger a series resistor is made, the less effect this dampening circuit has on the output node.

As is illustrated, there is a decay of the output, at −6 db, even with no capacitor, at 1 MHz. A dB falloff for output voltage without capacitor ('original') then starts to become noticeable at about 1 MHz, and drops off sharply thereafter.

A simulated result of an employment of a capacitor with a resistor for mitigating a transient glitch according to the principles of the present Application is illustrated. As is illustrated, a 50 pf capacitor, such as can be used as the capacitor 520, is used along with a variable values of resistance for a series resistance, such as the resistor 530, allows for various controlled db losses for different frequencies. As is illustrated with a 50 pF capacitor and resistance equal to 1 MegaOhm curve, the dB loss rates between the 1 Megaohm and the original loss rates (no capacitor 520, no resistor 530) are advantageously very similar.

Figure 9:
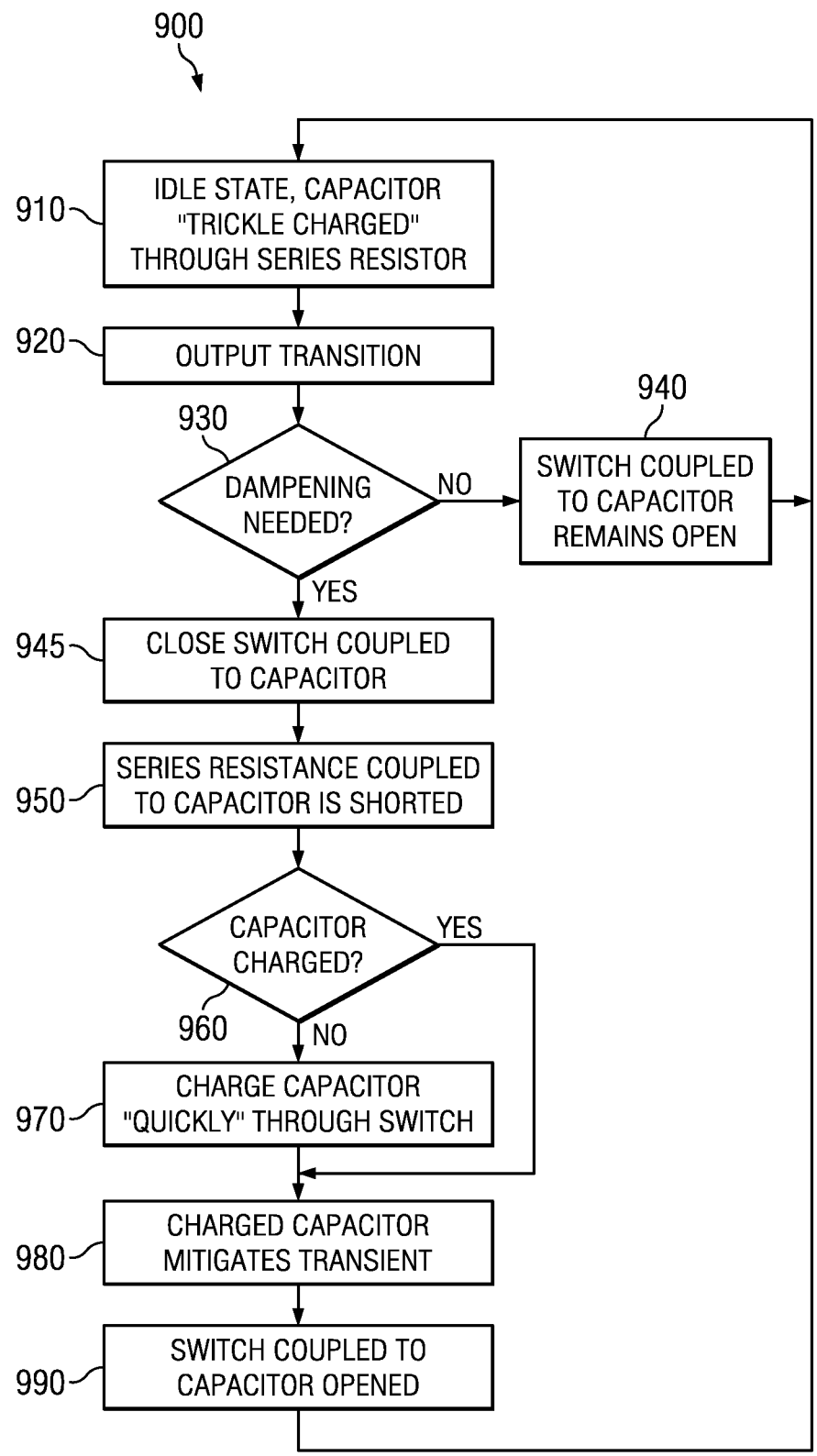
FIG. 9 illustrates a method for dynamically dampening a transient step response, such as can occur with employment of the circuit 500 of FIG. 5.

FIG. 9 illustrates a method 900 for dynamically dampening an unwanted transient step response (i.e. a "glitch"), such dampening as can occur with employment of the circuit 500. In the method 900, a capacitor is being charged the entire time that the output is idle, through employment the series resistor.

In a step 910, in an idle state, a capacitor, such as capacitor 520, is "trickle" charged, through a series resistor, such as resistor 530.

In a step 920, an output transition occurs.

In a step 930, it is determined in a dampening of a glitch is needed. If not, then the method 900 advances to a step 940, and a switch coupled to the capacitor, such as switch 940, remains open.

However, if a dampening of a glitch is needed, then the method 900 advances to a step 945, and the switch, such as switch 540, is closed.

As a result of closing the switch coupled to the capacitor, a series resistance, in a step 950, the series resistor coupled to the capacitor is shorted.

After opening the switch in step 950, in a step 960, a next occurrence depends upon whether the capacitor is substantially fully charged. If charged, the method 900 advances to step 980, if not the method 900 advances to a step 970.

In a step 970, the capacitor is charged 'quickly' through the switch, as the behavior of the capacitor is not to the same degree determined by the coupled series resistance. In some circumstances, this quick charge may result in a mini-glitch, although not to the same magnitude or problem as the glitch to be mitigated. The step 970 then advances to a step 980.

In a step 980, the charged capacitor mitigates a transient. For example, as the capacitor is fully charged, yet resists instantaneous changes in output voltages, a $v_{out}$ node is kept from spiking during a transition.

In a step 990, after a transition is complete, the switch coupled to the capacitor is then opened. The method then returns to step 910.

Those skilled in the art to which this application relates will appreciate that other and further additions, deletions, substitutions and modifications may be made to the described embodiments.

What is claimed is:

1. A circuit, comprising:
   a digital to analog (DA) resistance ladder having an analog output;
   a capacitor coupled to the analog output;
   a first resistance coupled from the capacitor to ground;
   a switch coupled to the capacitor in parallel to the resistor, wherein the switch, when closed, has a second resistance, and the first resistance is greater than the second resistance.

2. The circuit of claim 1, wherein the DA resistance ladder comprises a resistance of a first ladder value denoting a least significant bit, and a resistance of a second ladder value denoting a most significant bit.

3. The circuit of claim 1, wherein the switch is a NFET.

4. The circuit of claim 1, wherein a logic is coupled to a driver of the switch and the DA resistance ladder.

5. The circuit of claim 1, wherein the digital to analog ladder has a plurality of ladder switches that are controlled by a logic to convert a digital value to an analog output voltage at the analog output.

6. The circuit of claim 5, wherein the logic:
   a) closes the switch upon a transition of at least one ladder switch of the plurality of ladder switches; and b) opens the switch after a transition of a ladder switch of the plurality of ladder switches.

7. The circuit of claim 1, wherein the capacitor is replaceable with a second capacitor, wherein the capacitor is outside of an integrated circuit that contains the first resistance and the switch.

8. A system, comprising:
an analog output;
a capacitor coupled to the analog output ;
a first resistance coupled from the node to ground;
a switch coupled to the node in parallel to the resistor, wherein the switch, when closed, has a second resistance, and the first resistance is greater than the second resistance;
a driver coupled to a gate of the switch; and
a logic coupled to the driver, wherein the logic directs the driver to:
a) close the switch to mitigate a transient in the analog output, and
b) open the switch after the transient has occurred.

9. The system of claim 8, further comprising a digital to analog (DA) ladder coupled to the driver and the analog output, wherein the DA ladder comprises a resistance of a first value denoting a least significant bit, and a resistance of a second value denoting a most significant bit.

10. The system of claim 9, further comprising a voltage source and a voltage sink coupled to the DA ladder, wherein an analog signal of the analog signal output is a voltage value between the a voltage of the voltage source and a voltage of the voltage sink.

11. The system of claim 8, wherein a time constant of a the capacitor and the first resistance is substantially at least one order of magnitude greater than a time constant of a decay of the transient of the output voltage.

12. The system of claim 8, wherein the capacitor is replaceable with a second capacitor having a different capacitance.

13. The system of claim 8, wherein the capacitor is outside of an integrated circuit that contains the first resistance and the switch.

14. The system of claim 8, wherein the logic closes the switch upon a transition from a first output voltage to a second output voltage on an output node coupled to the capacitor.

15. The system of claim 14, wherein the logic:
a) closes the switch upon a transition of at least one ladder switch of the plurality of ladder switches; and
b) opens the switch after a transition of a ladder switch of the plurality of ladder switches.

16. A method, comprising:
trickle charging a capacitor through a series resistor;
transitioning a voltage at a output node coupled to the capacitor;
closing a switch if a dampening of a transient is needed;
shorting the series resistor by closing the switch; and
mitigating the transient through employment of the capacitor.

17. The method of claim 16, wherein the switch remain open if it is determined that a dampening is not occurring on the output node.

18. The method of claim 16, further comprising employing a digital to analog converter to change the voltage on the output node.

19. The method of claim 16, further comprising charging the capacitor by the transient if the capacitor is not fully charged by the trickle charge.

20. The method of claim 19, further comprising opening the switch after the transient is finished.

* * * * *